US007382199B2

(12) United States Patent
Talwalkar

(10) Patent No.: US 7,382,199 B2
(45) Date of Patent: Jun. 3, 2008

(54) METHODS FOR AUTO-CALIBRATION AND FAST TUNING OF VOLTAGE CONTROLLED OSCILLATORS IN PHASE-LOCK LOOPS

(75) Inventor: Niranjan Talwalkar, New York, NY (US)

(73) Assignee: NanoAmp Solutions, Inc. (KY)

( * ) Notice: Subject to any disclaimer, the term of this patent is extended or adjusted under 35 U.S.C. 154(b) by 0 days.

(21) Appl. No.: 11/347,114

(22) Filed: Feb. 3, 2006

(65) Prior Publication Data

US 2007/0182494 A1 Aug. 9, 2007

(51) Int. Cl.
*H03L 7/00* (2006.01)
(52) U.S. Cl. .......................................... 331/16; 331/44
(58) Field of Classification Search .................. 331/16, 331/44
See application file for complete search history.

(56) References Cited

U.S. PATENT DOCUMENTS

| 4,599,732 | A  | * | 7/1986  | LeFever ........................ 375/346 |
| 6,512,419 | B1 |   | 1/2003  | Adams et al. |
| 6,545,545 | B1 | * | 4/2003  | Fernandez-Texon ........ 331/1 R |
| 6,560,270 | B1 | * | 5/2003  | Hischke ....................... 375/136 |
| 6,566,966 | B1 |   | 5/2003  | Bellaouar et al. |
| 6,933,789 | B2 |   | 8/2005  | Molnar et al. |
| 7,209,936 | B2 | * | 4/2007  | Sullivan ......................... 708/3 |
| 2006/0238261 | A1 | * | 10/2006 | Rhee et al. ................... 331/16 |
| 2007/0040617 | A1 | * | 2/2007  | Koukab et al. ............... 331/16 |

* cited by examiner

*Primary Examiner*—Joseph Chang
(74) *Attorney, Agent, or Firm*—Fish & Richardson P.C.

(57) ABSTRACT

The present invention provides novel methods for the calibration and fast tuning of VCOs in PLLs. Information for coarse tuning before normal operation are calculated and stored. Therefore, these methods decrease significantly the time needed for a PLL to transition from one frequency to another. These methods include the steps of: determining a digital code $D_c$ to coarse tune to a calibration frequency, $F_c$; dividing the operating frequency band of the PLL into a plurality of sub-bands; determining and storing the information needed to generate the offsets for each sub-band. In tuning to a desired frequency, the following steps are taken: determining the sub-band corresponding to the desired frequency, F, generating the offset for that sub-band, calculating the digital code for coarse tuning the VCO to the desired sub-band, coarse tuning to a frequency within the desired sub-band, and fine tuning to the desired frequency, F.

20 Claims, 1 Drawing Sheet

METHODS FOR AUTO-CALIBRATION AND FAST TUNING OF VOLTAGE CONTROLLED OSCILLATORS IN PHASE-LOCK LOOPS

FIELD OF INVENTION

The present invention relates to methods for calibrating and fast tuning of voltage controlled oscillators (VCOs) in phase-lock loops (PLLs), and, in particular, it relates to methods for the fast tuning of VCOs in PLLs from one locked frequency to another.

BACKGROUND

The growing demand for wireless communications has led to designs for radios and other communication equipment that permit the integration of more components onto a single chip. Advances in CMOS semiconductor processing now allow the integration of radio receiver and transmitter onto a single-chip RF transceiver that reduces cost, size, and power consumption. This very high level of integration and the ability to fit a high density of transistors on silicon have enabled new solutions for existing problems.

PLLs using VCOs form the core components for most communication system hardware implementations. Applications with PLLs include radio-frequency (RF) receivers and transmitters for all communication standards, optical fiber communications, network communications, and storage systems applications.

In normal operations, the PLL is expected to step within a specified time from one locked frequency to another, e.g. stepping from a receive channel to a transmit channel in a transceiver. The specified time allowed for this transition in frequency is determined by the specifications of the communication system. During such a transition, the PLL must lock and settle to the new frequency and, equally importantly, the PLL must operate optimally at the new frequency within the specified time. Auto-calibrating the VCO allows the PLL to achieve the frequency transition within the specified time period in spite of the variations introduced during the manufacturing process.

PLLs are generally built with a phase detector, charge pump, filter, VCO, a digital control logic block, D, for programming the VCO, and a divider (÷N) such that the frequency of the output signal of the VCO, $F_{out}$, is locked to a multiple (N) of a reference frequency $F_{ref}$. FIG. 1 shows an example of a PLL using a VCO with coarse and fine tuning and FIG. 2 shows a VCO that can be used in a PLL. The coarse tuning is conducted using a switchable capacitor array (8b) that switches in the correct value of capacitance. The fine tuning then uses an analog control voltage signal, $V_{fine-tune}$, to set the capacitance of a voltage-dependent-capacitor or varactor, to "capture" the desired frequency. This combination of coarse and fine tuning allows the PLL designer to have a low voltage-to-frequency conversion gain in the VCO ($K_{vco}$), thereby improving a PLL's performance. In order to minimize $K_{vco}$, the value of the varactor is minimized and the values of the coarse tuning capacitors are maximized. Thus, it is essential to switch to the correct value of the coarse tuning capacitor each time a frequency step is requested.

Previously, one method for the fast tuning of a VCO involves the use of a coarse tuning varactor and a fine tuning varactor. The coarse tuning varactor is set based on the output of digital counter and a DAC (digital to analog converter). U.S. Pat. No. 6,566,966. This process is repeated each time the VCO steps from one frequency to another leading to a slow tuning response.

Another method involves the creation of a look-up table by turning on and off all the possible combinations of the coarse tuning switches and recording and storing the VCO output frequencies for a fixed setting of the fine tuning analog control voltage. U.S. Pat. No. 6,512,419. During normal operation, this table is used to obtain the correct digital code to coarse tune to the desired frequency. The calibration time for this approach is long and a large storage memory is required to store this information.

Another method involves choosing a set of switched varactors during calibration and using the fine tuning varactor to switch from one tuning frequency to another. U.S. Pat. No. 6,933,789. This method has a major drawback in that it cannot ensure a low $K_{vco}$. In the application of the method described in this patent, the frequency band of operation determines how small the fine tuning varactor can be and hence how low the $K_{vco}$ can be. Therefore, previously known methods are not suitable for use in applications requiring high speed PLL frequency transition times.

Due to the limitations of the prior art, it is therefore desirable to have novel methods that provide high speed VCO calibration and fast tuning during frequency transitions.

SUMMARY OF INVENTION

An object of this invention is to provide novel methods for calibrating VCOs in PLLs for applications in high speed tuning such that the time needed for the calibration is short.

Another object of this invention is to provide novel methods for calibrating VCOs in PLLs for applications that require high speed tuning, short calibration time, and limited memory storage.

The present invention provides novel methods for the auto-calibrating and fast tuning of VCOs in PLLs. It calculates and pre-stores information for coarse tuning before normal operation and therefore decreases significantly the time needed for a PLL to transition from one frequency to another. These methods include the following steps: determining the digital code $D_c$ to coarse tune to a calibration frequency, $F_c$; dividing said frequency band of the PLL into a plurality of sub-bands; determining and storing the information needed to generate the offsets for each sub-band, determining the sub-band of a desired frequency, generating the offset for the sub-band of the desired frequency, calculating the digital code for coarse tuning to the sub-band of the desired sub-band, using the digital code to coarse tuning to the sub-band, and fine tuning to the desired frequency.

An advantage of this invention is that the methods of calibrating VCOs in PLLs of this invention have applications that require high speed tuning, short calibration time, and limited memory storage.

DESCRIPTION OF DRAWINGS

The foregoing and other objects, aspects and advantages of the invention will be better understood from the following detailed description of preferred embodiments of this invention when taken in conjunction with the accompanying drawings in which.

DETAILED DESCRIPTION OF THE PREFERRED EMBODIMENTS

Figure 1:
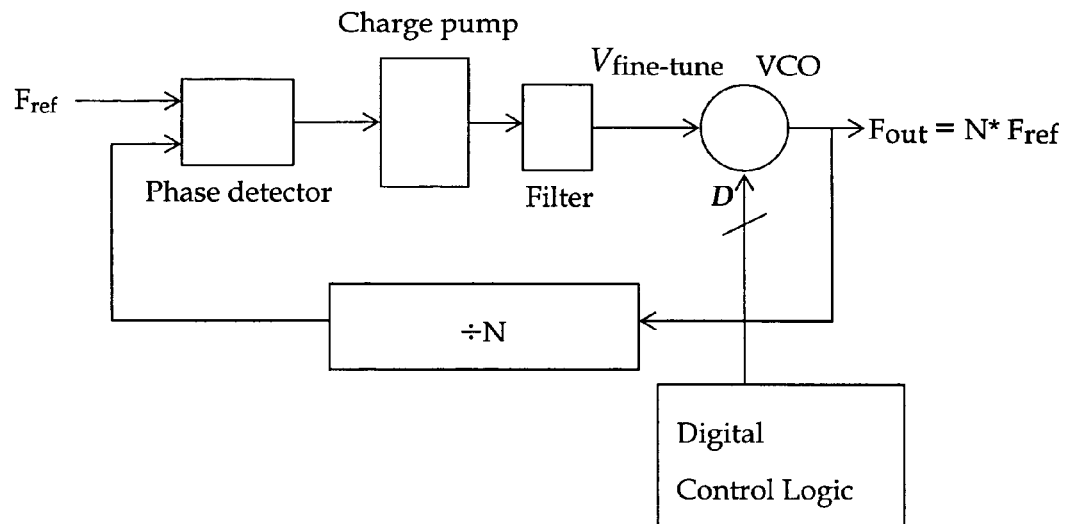
FIG. 1 is a simplified circuit diagram of an example of a PLL using a VCO, where the digital control logic block programs the PLL.

The presently preferred methods of this invention for the fast tuning of PLLs with VCOs within a predetermined frequency band of operation take advantage of the principle that digital code offsets of sub-bands as they relate to a calibration frequency are independent of variables introduced in the manufacturing process. Presently preferred methods calculates, calibrates, generates and stores information for generating offsets of sub-bands before actual operation and substantially decrease the time needed to tune to a desired frequency. These methods allow PLLs to quickly transition from one frequency to another. The information for generating offsets for each sub-bands are functions of the offsets and the digital code of the reference frequency, $F_c$. In some embodiments, they can be the actual digital code offsets for the sub-bands. In other preferred embodiments as discussed below, they can be used to calculate the offsets for each sub-band without the use of the digital codes for each of the sub-bands. The size of this information for generating the offsets is relatively small and therefore require small amount of memory for storage.

Presently preferred methods include the following steps: at each pre-chosen time, a calibration routine is used to coarse tune the PLL to a pre-determined calibration frequency, $F_c$. In preferred embodiments, in this initial calibration process, the fine tuning control voltage is fixed at a pre-determined value while the coarse tuning switches of the VCO are thrown to coarse tune to said calibration frequency $F_c$, i.e., to obtain a center frequency for the VCO as close as possible to $F_c$. Techniques such as a standard binary search technique may be used to obtain said center frequency. This initial calibration routine generates a digital code, Dc, for said calibration frequency, $F_c$. This digital code, Dc, is then stored in memory.

The frequency band of operation is then subdivided into a pre-determined number of sub-bands. The number of sub-bands determines the maximum variation of the fine tuning control voltage from the pre-determined value across the entire band of operating frequencies. This variation can be minimized by subdividing the entire frequency range into a larger number of bands.

The information for generating the offsets for these sub-bands can then be calculated and stored. The information is stored because they are relatively independent of process and operating conditions. Each digital code offset, when added to or subtracted from $D_c$, respectively, yields the digital code for coarse tuning the VCO to a frequency within that particular sub-band, i.e., to coarse tune to the sub-band. In the present discussion, this method of coarse tuning is referred to as coarse tuning to a frequency within a sub-band.

The choice of $F_c$ determines how the offsets are to be added or subtracted from the digital code $D_c$. If $F_c$ is the highest frequency of the frequency band, then offset for a sub-band is added to Dc to obtain the digital code for coarse tuning to a frequency within that particular sub-band. If $F_c$ is the lowest frequency of the frequency band, then the offset for a sub-band will be subtracted from Dc to obtain the digital code for coarse tuning to a frequency within that sub-band. If $F_c$ is an intermediate value between the highest and lowest frequency of the frequency band, offsets for a sub-band will either be added to or subtracted from $D_c$ depending on whether the frequency of the sub-band of interest is lower or higher than $F_c$.

There are a number of ways to obtain the offset for the sub-bands. In one method, the digital code for a particular frequency within a sub-band can be measured during the calibration process. The offsets for the sub-band can then be defined as either the digital code for that particular frequency subtracting $D_c$, or $D_c$ subtracting the digital code for that particular frequency, depending on the magnitude of the particular frequency relative to the calibration frequency. For example, if a switchable capacitor array is used to determine the digital code for the coarse tuning, flipping the switches of the capacitors in the switchable capacitor array can provide the offsets for the different frequencies in the sub-bands.

In another method, the offsets can be calculated using standard circuit simulators such as Spectre™ from Cadence Systems. For example, the extracted view of the VCO can be simulated to obtain the code $D_{high}$ for coarse tuning to the highest frequency in the band. Thus, $D_{high}$ is the digital code which, when inputted to the VCO, causes it to oscillate very close to the highest frequency of the band. The search for $D_{high}$ can be performed using an algorithm such as binary search. The other input to the VCO, $V_{ctrl}$, is set at a pre-determined fixed voltage. In an identical fashion, $D_{low}$, the digital code for coarse tuning to the lowest frequency in the band can be obtained. The other input to the VCO, $V_{ctrl}$, is again set at the same pre-determined fixed voltage as during the search for $D_{high}$. The total offset for the band, $O_{tot}$, is $D_{low}$, minus $D_{high}$ since $D_{low}$ is greater than $D_{high}$. This total offset is one type of the information that can be used for generating the offsets for each sub-band. It is a fixed number that can be stored in the digital memory.

Of course, the total offset does not necessarily have to be defined as the difference between the digital codes for coarse tuning to the highest and lowest frequencies. A different total offset $O_{tot}$ can be defined and calculated as the difference in the digital codes for coarse tuning to any two frequencies, $F_1$ and $F_2$, within said frequency band of operation.

If silicon measurements on a test run of a prototype show that the offset is not exactly as simulated, a more accurate offset can be obtained from measurements in an identical fashion to that described above. The corrected offset would then be hard-wired in the digital memory before mass production.

The offset for each for each of the sub-bands can then be calculated by interpolating or extrapolating the total offset, $O_{tot}$, over the frequency band. For example, when the $F_c$ is the highest frequency of the band and $O_{tot}$ is defined as the difference between the digital codes of the highest and lowest frequency within the pre-determined frequency band, the offset for each sub-band can be calculated by interpolating the total offset $O_{tot}$. The offset for the highest sub-band at the highest frequencies can equal zero and the offset for the lowest sub-band at the lowest frequencies can equal $O_{tot}$. The above described steps can be performed during normal operation or just once before the normal operation and stored in memory.

Variations of the above-described methods for determining the total offset can be used to obtain the offset for each sub-band. For example, the offset between two frequencies in the frequency band, not necessarily the highest and lowest, can be found in a similar manner. The offsets for the each sub-band can then be obtained by interpolating and/or extrapolating this new offset found over the frequencies of the entire band.

During normal operation, when the PLL is needed to lock to a desired lock frequency F (a desired frequency), within the frequency band, the difference between F and Fc determines the sub-band (the desired sub-band) to be used. Once the sub-band is determined, the offset for that sub-band, is calculated or generated from the information stored in memory or a look-up table, added to or subtracted from the stored code Dc to generate the digital code D for coarse tuning to the desired sub-band that the desired lock frequency F is located. After the coarse tuning process, the PLL then locks to the desired frequency F using the fine tuning control.

By refining the methods described above, other methods for the tuning of VCOs can be arrived. For example, instead of using one calibration frequency, a number of calibration frequencies can be used. These calibration frequencies effectively divide the frequency band of operation into a corresponding number of "smaller frequency bands" with a calibration frequency occupying a "smaller frequency band." Application of the above described methods for each of the "smaller frequency band" will allow for the tuning over the entire frequency band.

Figure 2:
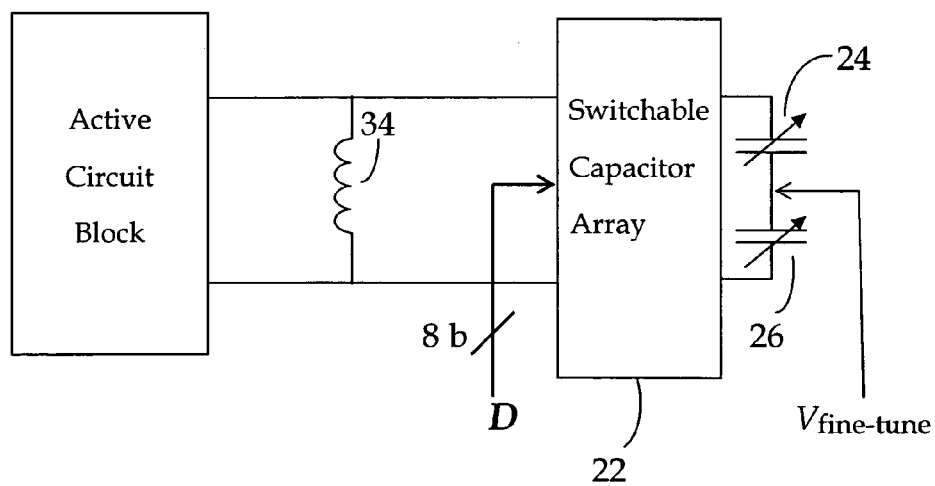
FIG. 2 is a simplified circuit schematic of an example of a VCO with a switchable capacitor array for coarse tuning and varactors for fine tuning.

The following presently preferred embodiments are specific applications of the fast tuning methods of this invention and further describe this invention. FIG. 2 shows an example of an inductor-capacitor based VCO with coarse and fine tuning where the fast tuning and auto-calibration methods of this invention can be applied. In this example the VCO, connected to an active circuit block, comprises of an inductor 34, two varactors 24 and 26 for the fine tuning, and a switchable capacitor array 22 for coarse tuning. The number of switchable capacitor array will determine the size of the digital code. If eight binary-weighted coarse-tuning capacitors are used in the capacitor array 22, then eight bits of a digital code, Dc, are applied to the coarse tuning array 22 to tune the VCO in coarse steps. A fine tuning voltage, $V_{fine-tune}$, the output of the filter in FIG. 1, is applied to the varactors.

An example of the calibration methods of this invention can be illustrated using the VCO circuit in FIG. 2 with a 1 nH inductor, 34, two varactors, 24 and 26, each with 1 pF nominal capacitance, and a 2.55 pF switchable coarse tuning capacitor array 22. Eight binary-weighted coarse tuning capacitors from C0 (smallest) to C7 (largest) can be used in the capacitor array 22 and are placed in parallel to form the switchable capacitor array. These capacitors have the values C0=0.01 pF, C1=0.02 pF, C2=0.04 pF, C3=0.08 pF, C4=0.16 pF, C5=0.32 pF, C6=0.64 pF, and C7=1.28 pF. The varactors yield a fine tuning coefficient, $K_{vco}$, of 100 MHz/V at an oscillation frequency of 3.68 GHz.

Embodiments 1 and 2 illustrate the above-described VCO of the fast tuning and calibration methods of this invention.

EMBODIMENT 1

If the frequency band of operation is 100 MHz wide and ranges from 3.67 GHz to 3.77 GHz, an example of the fast tuning method of this invention to lock this VCO within this range of frequency includes the following steps:

At each pre-chosen time, a calibration routine is used to coarse tune the PLL to the pre-determined calibration frequency, $F_c$, at 3.77 GHz. In this initial calibration process, the fine tuning control voltage is fixed at 1 volt while the coarse tuning switches are thrown using a standard binary search technique to obtain a center frequency for the VCO as close as possible to $F_c$=3.77 GHz. This initial calibration routine generates the digital code $D_c$=10000000. This generated Dc is then stored in memory.

The frequency range of operation is then subdivided into 5 bands, each 20 MHz wide. Therefore, the frequency ranges in GHz of the five sub-bands are: {3.75 GHz, 3.77 GHz}, {3.73 GHz, 3.75 GHz}, {3.71 GHz, 3.73 GHz}. (3.69 GHz, 3.71 GHz), and {3.67 GHz, 3.69 GHz}. The VCO center frequencies for the sub-bands are 3.76, 3.74, 3.72, 3.70, and 3.68 GHz respectively.

The offsets for these sub-bands can then be calculated and stored in a look-up table. Each offset, when added to Dc, respectively, yields the digital code for coarse tuning the VCO to a frequency within the sub-band. In this embodiment, the offsets can be calculated from the circuit diagram. The binary values for the offsets of the five bands are: $Oc_0$=00000001; $Oc_1$=00000011; $Oc_2$=00000111; $Oc_3$=00001001; and $Oc_4$=00001011. Each offset, when added to Dc, respectively, yields the VCO center frequencies of 3.76, 3.74, 3.72, 3.70, and 3.68 GHz.

During normal operation, when the PLL is needed to lock at a desired lock frequency F (a desired frequency), the difference between F and Fc can determine the sub-band (desired sub-band) to be used. Once the sub-band is determined, the pre-programmed offset for that sub-band is obtained from the look-up table, added to the stored code Dc to generate the code D for coarse tuning to a frequency within the sub-band (desired sub-band) of the lock frequency (desired frequency) F. The PLL then locks to the desired lock frequency F using the fine tuning control.

The maximum variation of the fine tuning control voltage from the desirable value of 1 volt is 100 mV across the entire region of operating frequencies. This variation can be minimized by subdividing the entire frequency range into a larger number of bands and increasing the size of the look-up table, e.g. by having 10 bands, the fine tuning control voltage variation drops to 50 mV.

Manufacturing process variation of 20% for the capacitors yields a small additional uncertainty of 40 mV in the tuning control voltage.

EMBODIMENT 2

If the frequency band of operation is 96 MHz wide and ranges from 3.674 GHz to 3.77 GHz, an example of fast tuning method of this invention to lock this VCO within this range of frequency includes the following steps:

At each pre-chosen time, a calibration routine is used to coarse tune the PLL to the pre-determined calibration frequency, $F_c$, to 3.77 GHz. In this initial calibration process, the fine tuning control voltage is fixed at 1 volt while the coarse tuning switches are thrown using a standard binary search technique to obtain a center frequency for the VCO as close as possible to $F_c$=3.77 GHz. This initial calibration routine generates the digital code $D_c$=10000000. This Dc is then stored in memory.

The frequency band of operation is subdivided into 16 sub-bands, each 6 MHz wide.

One method of calculating the offset for each sub-band and involve the use of standard circuit simulators such as Spectre™ from Cadence Systems. The extracted view of the VCO is simulated to obtain the code $D_{high}$ corresponding to the highest frequency in the band. Thus, $D_{high}$ is the digital code which, when inputted to the VCO, causes it to oscillate very close to the highest frequency of the band, i.e., coarse tune to the highest frequency of the band. The search for $D_{high}$ can be performed using an algorithm such as binary search. The other input to the VCO, $V_{ctrl}$, is set at a fixed voltage of 1 volt. In other variations of the methods for obtaining the offsets for each sub-band, the $V_{ctrl}$ can be set to other voltages.

In an identical fashion code $D_{low}$, the digital code for coarse tuning to lowest frequency in the band, can be obtained. The other input to the VCO, $V_{ctrl}$, is again set at 1 volt, the same fixed voltage as during the search for $D_{high}$.

The total offset for the band, $O_{tot}$, is $D_{low}-D_{high}$ since $D_{low}>D_{high}$. This total offset is a fixed number that is stored in the digital memory. In this example, the total offset, $O_{tot}$ is calculated to equal 00001011 and stored in the digital memory.

If silicon measurements on a test run of a prototype show that the offset is not exactly as simulated then a more accurate offset can be obtained from measurements in an identical fashion to that described above. The corrected offset would then be hard-wired in the digital memory before mass production.

The offset for each of the sub-bands can then be calculated by interpolating the total offset, $O_{tot}$ over the frequency band. The offset for the highest sub-band, i.e., the sub-band at the highest frequencies, is zero while the offset for the lowest sub-band, i.e., the sub-band at the lowest frequencies, is $O_{tot}$. The above described steps can be performed during normal operation or just performed once before normal operation and then stored in memory.

During normal operation, when the PLL is needed to lock to a desired lock frequency F, within the frequency band. The sub-band for the desired lock frequency can easily be determined by examining the frequency ranges of the sub-bands. Once that is determined, the "digital control logic" then calculates the offset associated with the sub-band of interest by linearly interpolating the offset with "0" for the highest sub-band and $O_{tot}$ for the lowest sub-band. This offset is then added to the stored code $D_c$ to generate the digital code D for coarse tuning to a frequency within the sub-band (desired sub-band) of the desired lock frequency F. After the coarse tuning process, the PLL then locks to the target frequency F using the fine tuning control.

While the present invention has been described with reference to certain preferred embodiments, it is to be understood that the present invention is not limited to such specific embodiments. Rather, it is the inventor's contention that the invention be understood and construed in its broadest meaning as reflected by the following claims. Thus, these claims are to be understood as incorporating not only the preferred embodiments described herein but all those other and further alterations and modifications as would be apparent to those of ordinary skilled in the art.

I claim:

1. A method for fast tuning of a voltage controlled oscillator in a phase-lock loop, comprising the steps of:
    selecting $F_c$, a calibration frequency;
    determining $D_c$, a digital code for coarse tuning to said calibration frequency;
    dividing a frequency band of operation into a predetermined number of sub-bands;
    determining information for generating an offset for each sub-band with respect to said calibration frequency; and
    storing said information.

2. The method for fast tuning of a voltage controlled oscillator in a phase-lock loop of claim 1 wherein
    a digital code for coarse tuning to a frequency within a sub-band is the sum of the offset for said sub-band and $D_c$, if the frequencies within said sub-band are less then $F_c$;
    a digital code for coarse tuning to a frequency within a sub-band is $D_c$ minus the offset for said sub-band, if the frequencies within said sub-band are greater than $F_c$; and
    a digital code for coarse tuning to a frequency within a sub-band is $D_c$, if $F_c$ is within said sub-band.

3. The method for fast tuning of a voltage controlled oscillator in a phase-lock loop of claim 1 wherein said information for generating said offset for each sub-band is a total offset $O_{tot}$ and the method for determining said total offset $O_{tot}$ comprising the sub-steps of:
    obtaining a digital code $D_1$ for coarse tuning to $F_1$, a frequency within said frequency band of operation;
    obtaining a digital code $D_2$ for coarse tuning to $F_2$, a frequency within said frequency band of operation wherein $F_1$ is greater than $F_2$;
    calculating the total offset, $O_{tot}$ wherein $O_{tot}$ equals $D_2$ minus $D_1$.

4. The method for fast tuning of a voltage controlled oscillator in a phase-lock loop of claim 2 wherein said information for generating the offset for each sub-band is a total offset $O_{tot}$ and a method for determining said total offset $O_{tot}$ comprising the sub-steps of:
    obtaining a digital code $D_1$ for coarse tuning to $F_1$, a frequency within said frequency band of operation;
    obtaining a digital code $D_2$ for coarse tuning to $F_2$, a frequency within said frequency band of operation wherein $F_1$ is greater than $F_2$;
    calculating the total offset, $O_{tot}$ wherein $O_{tot}$ equals $D_2$ minus $D_1$.

5. The method for fast tuning of a voltage controlled oscillator in a phase-lock loop of claim 3 wherein $F_1$ is the highest frequency of said frequency band of operation and $F_2$ is the lowest frequency of said frequency band of operation.

6. The method for fast tuning of a voltage controlled oscillator in a phase-lock loop of claim 4 wherein $F_1$ is the highest frequency of said frequency band of operation and $F_2$ is the lowest frequency of said frequency band of operation.

7. The method for fast tuning of a voltage controlled oscillator in a phase-lock loop of claim 1 wherein said information for generating said offset for each sub-band is the digital code offset with respect to Dc for each sub-band.

8. The method for calibrating a voltage controlled oscillator in a phase-lock loop of claim 2 wherein said information for generating said offset for each sub-band is the digital code offset with respect to Dc for each sub-band.

9. A method for fast tuning of a voltage controlled oscillator in a phase-lock loop to a desired frequency, F, within a frequency band of operation, comprising the steps of:
    selecting a calibration frequency, $F_c$;
    determining a digital code, $D_c$, for coarse tuning to said calibration frequency $F_c$;
    dividing said frequency band of operation into a plurality of sub-bands;
    determining information for generating an offset for each sub-band;
    storing the information;
    determining a sub-band corresponding to said desired frequency;
    generating the offset for said sub-band from said stored information;
    calculating a digital code D for coarse tuning to a frequency within said desired sub-band as a function of the offset said desired sub-band;

coarse tuning to a frequency within said sub-band using said digital code D; and fine tuning to said desired frequency F.

10. The method for fast tuning of a voltage controlled oscillator in a phase-lock loop of claim 9 wherein a digital code for coarse tuning to a frequency within said sub-band is the sum of the offset for said sub-band and $D_c$, if the frequencies within said sub-band are less then $F_c$;

a digital code for coarse tuning to a frequency within said sub-band is the $D_c$ minus the offset for said sub-band, if the frequencies within said sub-band are greater than $F_c$; and a digital code for coarse tuning to a frequency within said sub-band is $D_c$, if $F_c$ is within said sub-band.

11. The method for fast tuning of a voltage controlled oscillator in a phase-lock loop of claim 9 wherein said information for generating said offset for each sub-band is a total offset, $O_{tot}$, and the method for determining said total offset $O_{tot}$ comprises the sub-steps of:

obtaining a digital code $D_1$ for coarse tuning to $F_1$, a frequency within said frequency band of operation;

obtaining a digital code $D_2$ for coarse tuning to $F_2$, a frequency within said frequency band of operation wherein $F_1$ is greater than $F_2$; and calculating the total offset, $O_{tot}$, wherein $O_{tot}$ equals $D_2$ minus $D_1$.

12. The method for fast tuning of a voltage controlled oscillator in a phase-lock loop of claim 11 wherein in the step to generate the offset for said desired sub-band comprising the substep of: interpolating or extrapolating the total offset, $O_{tot}$, to obtain the offset for said sub-band.

13. The method for fast tuning of a voltage controlled oscillator in a phase-lock loop of claim 10 wherein said information for generating the offset for each subset is a total offset, $O_{tot}$ and the method for determining said total offset $O_{tot}$ comprises the sub-steps of:

obtaining a digital code $D_1$ for coarse tuning to $F_1$, a frequency within said frequency band of operation;

obtaining a digital code $D_2$ for coarse tuning to $F_2$, a frequency within said frequency band of operation wherein $F_1$ is greater than $F_2$; and calculating the total offset, $O_{tot}$, wherein $O_{tot}$ equals $D_2$ minus $D_1$.

14. The method for fast tuning of a voltage controlled oscillator in a phase-lock loop of claim 13 wherein in the step to obtain the offset for said desired sub-band comprising the substep of: interpolating or extrapolating the total offset, $O_{tot}$, to obtain the offset for said desired sub-band.

15. The method for fast tuning of a voltage controlled oscillator in a phase-lock loop of claim 11 wherein $F_1$ is the highest frequency of said frequency band of operation and $F_2$ is the lowest frequency of said frequency band of operation.

16. The method for fast tuning of a voltage controlled oscillator in a phase-lock loop of claim 12 wherein $F_1$ is the highest frequency of said frequency band of operation and $F_2$ is the lowest frequency of said frequency band of operation.

17. The method for fast tuning of a voltage controlled oscillator in a phase-lock loop of claim 9 wherein the information for generating the offset for each sub-band is the digital code offset with respect to Dc for each sub-band.

18. The method for fast tuning of a voltage controlled oscillator in a phase-lock loop of claim 10 wherein the information for generating the offset for each sub-band is the digital code offset with respect to Dc for each sub-band.

19. The method for fast tuning of a voltage controlled oscillator in a phase-lock loop of claim 13 wherein $F_1$ is the highest frequency of said frequency band of operation and $F_2$ is the lowest frequency of said frequency band of operation.

20. A method for fast tuning of a voltage controlled oscillator in a phase-lock loop to a desired frequency, F, within a frequency band of operation, comprising the steps of:

selecting a calibration frequency, $F_c$;

determining a digital code, $D_c$, for coarse tuning to said calibration frequency $F_c$;

dividing said frequency band of operation into a plurality of sub-bands;

obtaining a digital code $D_1$ for coarse tuning to $F_1$, a frequency within said frequency band of operation;

obtaining a digital code $D_2$ for coarse tuning to $F_2$, a frequency within said frequency band of operation wherein $F_1$ is greater than $F_2$; and calculating the total offset, $O_{tot}$, wherein $O_{tot}$ equals $D_2$ minus $D_1$;

storing said total offset, $O_{tot}$;

determining a sub-band corresponding to said desired frequency, F;

generating the offset for said sub-band by interpolating or extrapolating the total offset, $O_{tot}$, to obtain the offset for said sub-band;

calculating a digital code D for coarse tuning to a frequency within said sub-band as a function of the offset said sub-band;

coarse tuning to a frequency within said sub-band using said digital code D; and fine tuning to said desired frequency F; wherein a digital code for coarse tuning to a frequency within a sub-band is the sum of the offset for said sub-band and $D_c$, if the frequencies within said sub-band are less then $F_c$;

a digital code for coarse tuning to a frequency within a sub-band is the $D_c$ minus the offset for said sub-band, if the frequencies within said sub-band are greater than $F_c$; and a digital code for coarse tuning to a frequency within a sub-band is $D_c$, if $F_c$ is within said sub-band.

* * * * *

UNITED STATES PATENT AND TRADEMARK OFFICE
CERTIFICATE OF CORRECTION

PATENT NO. : 7,382,199 B2
APPLICATION NO. : 11/347114
DATED : June 3, 2008
INVENTOR(S) : Talwalkar It is certified that error appears in the above-identified patent and that said Letters Patent is hereby corrected as shown below:

In column 8, line 44, in claim 7, delete "Dc" and insert -- $D_c$ --, therefor.

In column 8, line 48, in claim 8, delete "Dc" and insert -- $D_c$ --, therefor.

In column 9, line 29-30, in claim 12, delete "wherein in the step to" and insert -- wherein the step to --, therefor.

In column 9, line 30-31, in claim 12, delete "comprising" and insert -- comprises --, therefor.

In column 9, line 46-47, in claim 14, delete "wherein in the step to" and insert -- wherein the step to --, therefor.

In column 9, line 47, in claim 14, delete "comprising" and insert -- comprises --, therefor.

In column 10, line 7, in claim 17, delete "Dc" and insert -- $D_c$ --, therefor.

In column 10, line 11, in claim 18, delete "Dc" and insert -- $D_c$ --, therefor.

Signed and Sealed this

Twenty-sixth Day of August, 2008

JON W. DUDAS
*Director of the United States Patent and Trademark Office*